United States Patent
Nakayama

(10) Patent No.: US 9,455,358 B2
(45) Date of Patent: Sep. 27, 2016

(54) IMAGE PICKUP MODULE AND IMAGE PICKUP UNIT

(71) Applicant: OLYMPUS CORPORATION, Tokyo (JP)

(72) Inventor: Takashi Nakayama, Ina (JP)

(73) Assignee: OLYMPUS CORPORATION, Tokyo (JP)

( * ) Notice: Subject to any disclaimer, the term of this patent is extended or adjusted under 35 U.S.C. 154(b) by 189 days.

(21) Appl. No.: 14/291,178

(22) Filed: May 30, 2014

(65) Prior Publication Data

US 2014/0264697 A1  Sep. 18, 2014

Related U.S. Application Data

(63) Continuation of application No. PCT/JP2012/072882, filed on Sep. 7, 2012.

(30) Foreign Application Priority Data

Dec. 5, 2011  (JP) .................................. 2011-266073

(51) Int. Cl.
*H01L 27/146*  (2006.01)
*H01L 31/02*  (2006.01)
*G02B 7/02*  (2006.01)
*H04N 5/225*  (2006.01)

(52) U.S. Cl.
CPC ........... *H01L 31/02005* (2013.01); *G02B 7/02* (2013.01); *H01L 27/1469* (2013.01); *H01L 27/14618* (2013.01); *H04N 5/2253* (2013.01);
(Continued)

(58) Field of Classification Search
CPC ........... H01L 27/146; H01L 31/02002; H01L 31/02005; H01L 31/0224

USPC ........... 250/208.1, 214.1, 239; 257/432, 692, 257/693, 698, 758
See application file for complete search history.

(56) References Cited

U.S. PATENT DOCUMENTS

| | | | |
|---|---|---|---|
| 5,436,492 A | 7/1995 | Yamanaka | |
| 6,940,140 B1* | 9/2005 | Ikeda | H01L 27/14618 257/433 |
| 7,893,956 B2* | 2/2011 | Ayrenschmalz | A61B 1/0011 348/65 |

FOREIGN PATENT DOCUMENTS

| | | | |
|---|---|---|---|
| JP | 2000-092477 A | 3/2000 | |
| JP | 2004-031498 A | 1/2004 | |
| JP | 2006-051258 A | 2/2006 | |

(Continued)

OTHER PUBLICATIONS

Extended Supplementary European Search Report dated Jun. 29, 2015 from related European Application No. 12 85 4656.1.

(Continued)

*Primary Examiner* — Kevin Pyo
(74) *Attorney, Agent, or Firm* — Scully, Scott, Murphy & Presser, PC

(57) ABSTRACT

An image pickup module includes: a wiring board including a first main surface on which chip electrodes are disposed and a second main surface on which the cable electrodes connected respectively to the chip electrodes via respective through wirings are disposed; an image pickup device chip including external electrodes bonded respectively to the chip electrodes; and a cable including conductive wires bonded respectively to the cable electrodes, in which all of the cable electrodes are disposed in a region not facing a region where the chip electrodes are disposed.

10 Claims, 7 Drawing Sheets

(52) U.S. Cl.
CPC ..... *H04N 5/2257* (2013.01); *H01L 2924/0002* (2013.01)

(56) References Cited

FOREIGN PATENT DOCUMENTS

| JP | 2006-324304 A | 11/2006 |
| JP | 2010-263020 A | 11/2010 |
| JP | 2011-188375 A | 9/2011 |

OTHER PUBLICATIONS

International Search Report dated Dec. 4, 2012 issued in PCT/JP2012/072882.

* cited by examiner ously to the cable electrodes, wherein all of the cable electrodes are disposed in a region which does not face a region where the chip electrodes are disposed; and an optical member which forms an image of an object on a light-receiving surface of the image pickup device chip.

IMAGE PICKUP MODULE AND IMAGE PICKUP UNIT

CROSS REFERENCE TO RELATED APPLICATION

This application is a continuation application of PCT/JP2012/072882 filed on Sep. 7, 2012 and claims benefit of Japanese Application No. 2011-266073 filed in Japan on Dec. 5, 2011, the entire contents of which are incorporated herein by this reference.

BACKGROUND OF THE INVENTION

1. Field of the Invention

The present invention relates to an image pickup module including an image pickup chip, a wiring board bonded to the image pickup chip, and a cable connected to the image pickup chip via the wiring board, and an image pickup unit including the image pickup module.

2. Description of the Related Art

The image pickup module 101 shown in FIG. 1 is disclosed in Japanese Patent Application Laid-Open Publication No. 2010-263020. The image pickup module 101 includes a cover glass 110, an image pickup device chip 120, a wiring board 130, and a cable 140. The cover glass 110 and the image pickup device chip 120 are adhered to each other with an adhesion layer 119, and the image pickup device chip 120 and the wiring board 130 are bonded to each other with a reinforcing member 129. The bonding portion between the wiring board 130 and the cable 140 is covered with a reinforcing member 149.

External electrodes 122 of the image pickup device chip 120 are bonded to chip electrodes 132 of the wiring board 130. The wiring board 130 includes through holes 131 which reach the rear surfaces of the chip electrodes 132. Conductive wires 142 of the cable 140 are bonded in a state where the conductive cables 142 are inserted into the through holes 131, thereby being electrically connected to the chip electrodes 132.

In the image pickup module 101, when the conductive wires 142 inserted into the through holes 131 of the wiring board 130 are bonded, thermal energy or mechanical load is applied also to the bonding portions between the external electrodes 122 and the chip electrodes 132 which have been already bonded to each other.

SUMMARY OF THE INVENTION

An image pickup module according to an embodiment of the present invention includes: a wiring board including a first main surface on which chip electrodes are disposed and a second main surface on which cable electrodes connected respectively to the chip electrodes via respective through wirings are disposed; an image pickup device chip including external electrodes bonded respectively to the chip electrodes; and a cable having conductive wires bonded respectively to the cable electrodes, wherein all of the cable electrodes are disposed in a region which does not face a region where the chip electrodes are disposed.

An image pickup unit according to another embodiment of the present invention comprises: an image pickup module including: a wiring board including a first main surface on which chip electrodes are disposed and a second main surface on which cable electrodes connected respectively to the chip electrodes via respective through wirings are disposed; an image pickup device chip including external electrodes bonded respectively to the chip electrodes; and a cable including conductive wires bonded respectively to the cable electrodes, wherein all of the cable electrodes are disposed in a region which does not face a region where the chip electrodes are disposed; and an optical member which forms an image of an object on a light-receiving surface of the image pickup device chip.

DETAILED DESCRIPTION OF THE PREFERRED EMBODIMENT

<First Embodiment>

Description will be made on a structure of an image pickup module 1 according to an embodiment of the present invention with reference to FIGS. 2 to 4B. All of the figures are pattern diagrams for illustration, and the vertical and horizontal dimensional ratio and the like are different from the actual ratio and the like. There is a case where illustration of a part of constituent elements is omitted.

Figure 1:
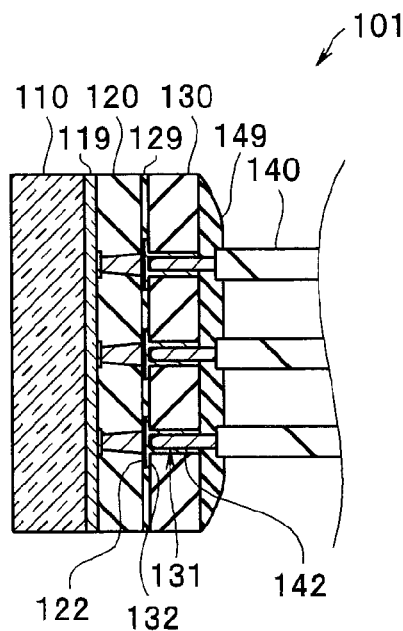
FIG. 1 is a cross-sectional view for illustrating a structure of a conventional image pickup module.
Figure 2:
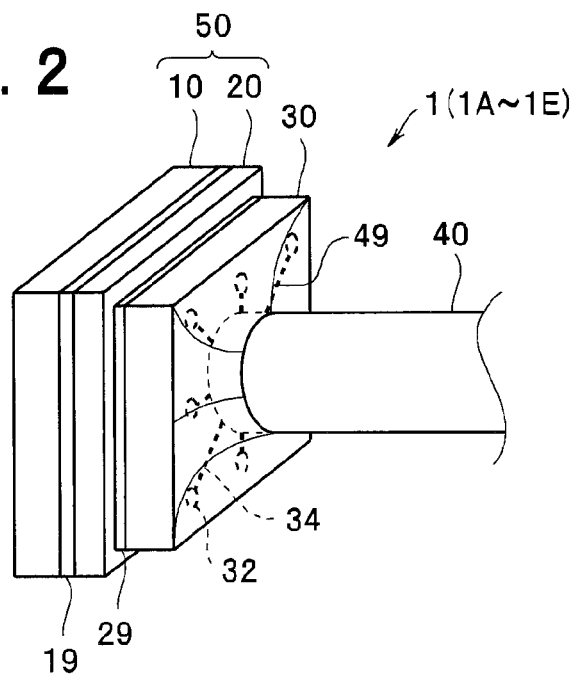
FIG. 2 is a perspective view for illustrating a structure of an image pickup module according to an embodiment.
Figure 3:
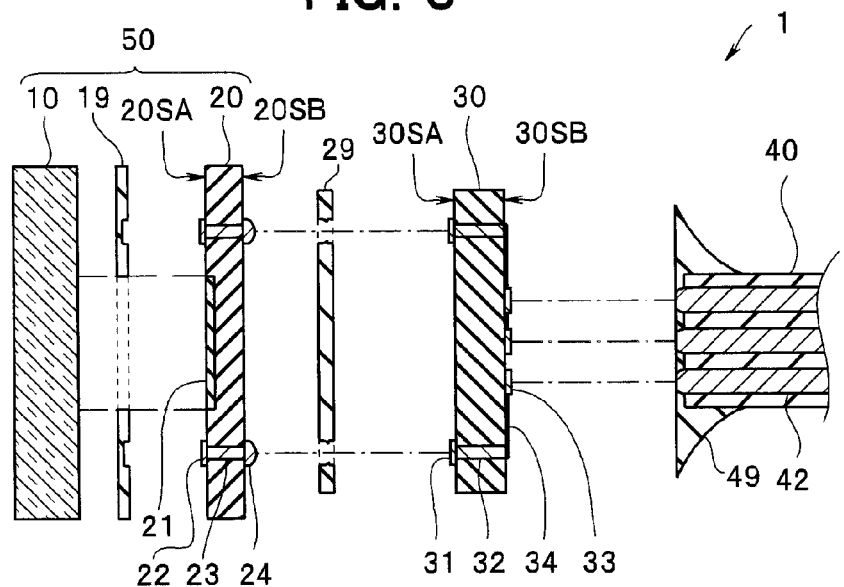
FIG. 3 is a cross-sectional exploded view for illustrating the structure of the image pickup module according to the embodiment.

As shown in FIGS. 2 and 3, the image pickup module 1 includes a cover glass 10, an image pickup device chip 20, a wiring board 30, and a cable 40. Note that the image pickup device chip 20 to which the cover glass 10 is bonded is referred to as an image pickup chip 50.

A CCD 21 as a solid-state image pickup device is formed at a substantially center portion of a front surface 20SA of the image pickup device chip 20 composed of a semiconductor such as silicon. Wirings (not shown) extending from a signal processing circuit (not shown) that is connected to the CCD 21 are connected to external electrodes 24 on a rear surface 20SB via CCD electrode pads 22 and through wirings 23.

The transparent cover glass 10 is adhered to the front surface 20SA of the image pickup device chip 20 via the adhesion layer 19. The adhesion layer 19 is not disposed on the CCD 21. As described later, the image pickup chip 50 is manufactured by cutting a bonding wafer 50W (see FIG. 5), to be singulated into individual pieces using the wafer-level chip size package (WL-CSP) technology. Therefore, the outer size of the cover glass 10 is same as the outer size of the image pickup device chip 20.

The external electrodes 24 on the rear surface 20SB of the image pickup chip 50 are bonded to chip electrodes 31 on the first main surface 30SA of the wiring board 30. The part between the image pickup chip 50 and the wiring board 30 is sealed with a sealing resin 29. The outer size of the wiring board 30 is smaller than the outer size of the image pickup chip 50.

Conductive wires 42 of the cable 40 are bonded to cable electrodes 33 on the second main surface 30SB of the wiring board 30. The cable electrodes 33 are connected to the chip electrodes 31 on the first main surface 30SA via through wirings 32 and front wirings 34 on the second main surface 30SB. The bonding portion between the wiring board 30 and the cable 40 is covered with a sealing resin 49. For the sake of convenience of illustration, the conductive wires 42 are all shown in a linear shape. However, the conductive wires 42 may be partly bent or may be twisted each other.

The image pickup module 1 has a feature in a relative arrangement, i.e., a positional relationship between the chip electrodes 31 and cable electrodes 33 of the wiring board 30.

Figure 4A:
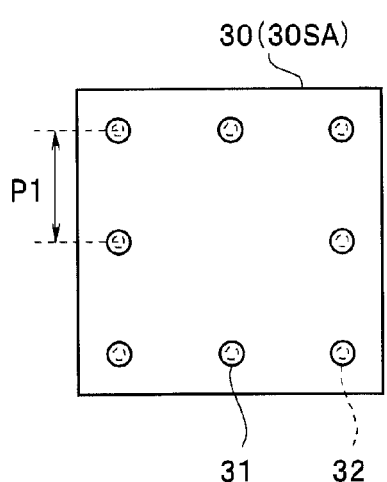
FIG. 4A is a plan view for illustrating a wiring board of the image pickup module according to the embodiment, and shows a first main surface.
Figure 4B:
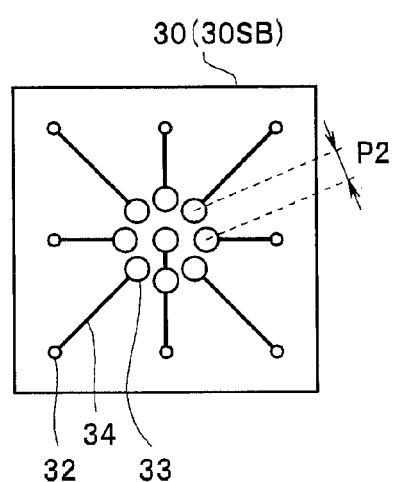
FIG. 4B is a plan view for illustrating a wiring board of the image pickup module according to the embodiment, and shows a second main surface.

That is, as shown in FIG. 4A, FIG. 4B, eight chip electrodes 31 are disposed in an outer peripheral portion of the first main surface 30SA of the wiring board 30 (in the vicinity of the outer perimeter of the wiring board 30, as viewed in a planar view, that is, the side closer to the periphery on the surface) and nine cable electrodes 33 are disposed in a center portion of the second main surface 30SB (in the vicinity of the center of the wiring board 30 and around the vicinity of the center, as viewed in a planar view, that is, the inner side on the surface). An arrangement interval P1 between a plurality of chip electrodes 31 arranged in the outer peripheral portion is larger than an arrangement interval P2 between a plurality of cable electrodes 33 arranged in the center portion.

The chip electrodes 31 and the cable electrodes 33 are connected to each other via the through wirings 32. However, in the image pickup module 1, the cable electrodes 33 are disposed in the region which does not face a region where the chip electrodes 31 are disposed. In other words, in the transparent plan view, the cable electrodes 33 and the chip electrodes 31 are not displayed in an overlapped manner.

That is, the chip electrodes 31 are disposed directly on the through wirings 32, on the other hand, the cable electrodes 33 are disposed, via the front wirings 34, in the center portion of the wiring board 30, the center portion being apart from the through wirings 32.

Next, description will be made on the manufacturing method of the image pickup module 1.

The image pickup module 1 is manufactured by bonding the cable 40 to the second main surface 30SB of the wiring board 30 and then bonding the CSP type image pickup chip 50 to the first main surface 30SA of the wiring board 30.

<Manufacturing of Image Pickup Chip>

Figure 5:
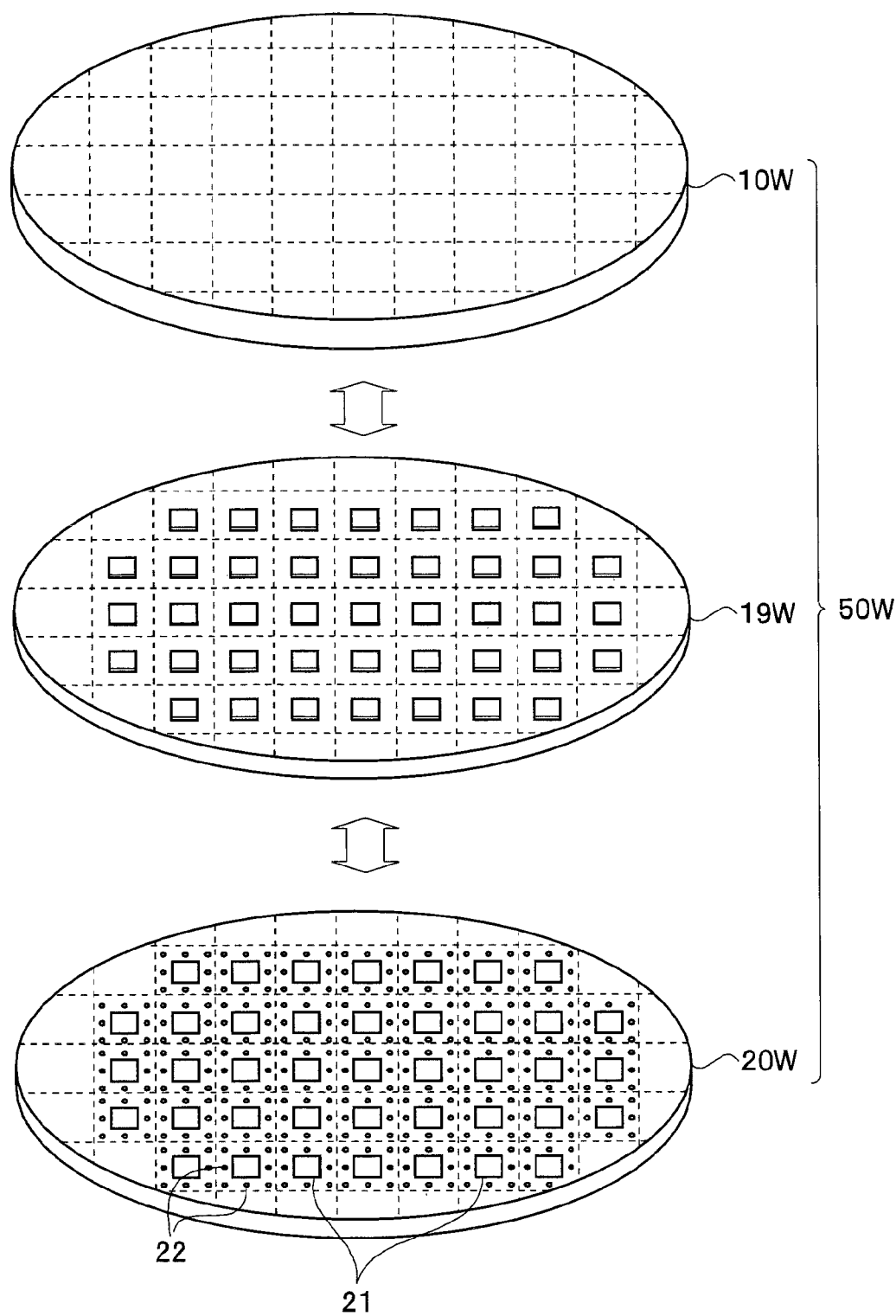
FIG. 5 is a perspective view for illustrating a manufacturing method of an image pickup chip of the image pickup module according to the embodiment.

As shown in FIG. 5, a plurality of CCDs 21 and a plurality of signal processing circuits (not shown) are formed on the front surface of a silicon wafer 20W using a publicly known semiconductor technology. A microlens and a color filter may be disposed on each of the CCDs 21. In addition, a CMOS image sensor or the like may be used as a solid-state image pickup device.

Furthermore, a plurality of CCD electrode pads 22 connected to the CCDs 21 through respective wirings (not shown) extended from the signal processing circuit are disposed in outer peripheral portions of the respective CCDs 21.

<Manufacturing of Bonding Wafer>

The bonding wafer 50W is manufactured by adhering a transparent glass wafer 10W onto the front surface of the silicon wafer 20W, that is, the surface on which the CCDs 21 are formed, via an adhesion layer 19W. The adhesion layer 19W is provided with openings formed at least on effective image pickup device forming areas of the CCDs 21. Accordingly, cavity portions are formed between the area of the silicon wafer 20W where the CCDs 21 are formed and the glass wafer 10W. Note that there is a case where it is not necessary to form cavity portions depending on the specifications of the image pickup module.

<Manufacturing of Through Wiring>

An etching mask which includes openings at positions facing the CCD electrode pads 22 is disposed on the rear surface of the bonding wafer 50W (silicon wafer 20W) using a photoresist. Through holes, each of which penetrates through the silicon wafer 20W to reach the rear surface of each of the CCD electrode pads 22, are formed by using dry etching such as ICP-RIE from the rear surface side. When the through holes are formed, wet etching using alkaline solution such as KOH or TMAH may be used, for example.

Next, the through wirings 23 made of a conductive material, each of which covers the inside of the through holes, are manufactured, and the inside of each of the through holes is filled with the conductive material or the like. Furthermore, the external electrodes 24 are manufactured on the rear surface sides of the respective through wirings 23. Each of the external electrodes 24 is a convex-shaped bump made of gold, solder, or the like. Each of the external electrodes 24 is manufactured by forming a plating bump, a stud bump, or the like on an electrode pattern, for example.

<Singulation>

A plurality of image pickup chips 50 are manufactured all at once by cutting/singulating the bonding wafer 50W along the dashed lines shown in FIG. 5 with a blade dicing method.

<Manufacturing of Wiring Board>

The wiring board 30 is separately manufactured using a double-faced wiring board, for example. The wiring board 30 includes a plurality of chip electrodes 31 on the outer peripheral portion of the first main surface 30SA. The positions of the respective chip electrodes 31 are set so as to coincide with the positions of the corresponding external electrodes 24 of the image pickup chip 50. The through wirings 32 which reach the second main surface 30SB are respectively formed directly under the chip electrodes 31. On the other hand, the wiring board 30 includes a plurality of cable electrodes 33 in the center portion of the second main surface 30SB. The cable electrodes 33 connected respectively to the through wirings 32 via the front wirings 34 are set so as to coincide with the positions of corresponding conductive wires 42 of the cable 40. As already described above, in order to reduce the diameter size of the image pickup module 1, the outer size of the wiring board 30 is smaller than the outer size of the image pickup chip 50.

<Bonding between Wiring Board and Cable>

The cable electrodes 33 of the wiring board 30 and the conductive wires 42 of the cable 40 are bonded to each other. For the bonding, energy has to be applied externally to the bonding portions. In the case of solder bonding, for example, the bonding sites to which thermal energy is locally applied are heated equal to or higher than the solder melting point. Heater heating, laser heating, lamp heating, or the like is used for the local heating, and heating may be performed while applying pressure as needed. Bonding may be performed by applying different energy, for example, ultrasound energy, instead of application of thermal energy.

After the bonding, the sealing resin 49 is disposed around the bonding portions, in order to improve the mechanical strength of the bonding portions.

<Bonding between Image Pickup Chip and Wiring Board>

The external electrodes 24 of the image pickup chip 50 are bonded to the chip electrodes 31 of the wiring board 30 to which the cable 40 is bonded. For the bonding, energy has to be applied to the bonding portions, similarly as in the bonding between the cable electrodes 33 and the cable 40.

Figure 6:
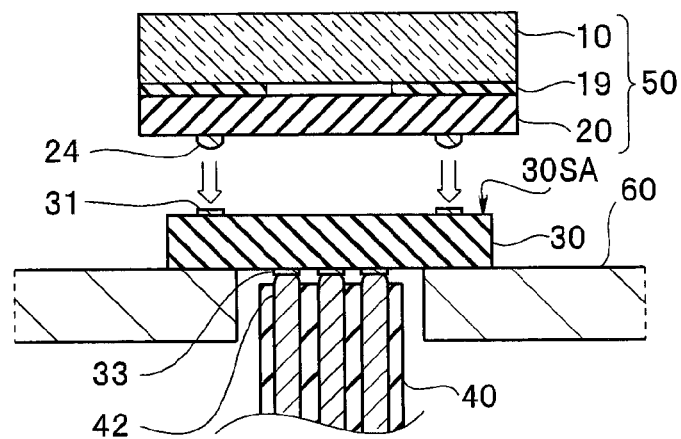
FIG. 6 is a cross-sectional view for illustrating a manufacturing method of the image pickup module according to the embodiment.

As shown in FIG. 6, the wiring board 30 is held at a stage 60 having holes in which the cable 40 is insertable, such that the first main surface 30SA faces upward. The position of the image pickup chip 50 is adjusted such that the external electrodes 24 abut the chip electrodes 31 on the first main surface 30SA of the wiring board 30. Thermal energy is then locally applied to the abutting portions between the chip electrodes 31 and the external electrodes 24 through the stage 60, and thereby the bonding processing is performed.

Though not shown in FIG. 6, the sealing resin 29 is disposed at the bonding portions as shown in FIG. 3, etc. The sealing resin 29 seals around the bonding portions to increase the connection reliability, and at the same time, bonds the image pickup chip 50 and the wiring board 30. Epoxy resin, silicone resin, acrylic resin, phenol resin, or the like is used as the sealing resin 29.

An anisotropic conductive paste (ACP), an anisotropic conductive film (ACF), a non-conductive paste (NCP), or the like may be used as the sealing resin 29. The sealing resin 29 does not necessarily have to be used.

As already described, in the image pickup module 1, the chip electrodes 31 and the cable electrodes 33 are provided at the positions so as not to coincide with each other on the front surface and on the rear surface of the wiring board 30. Therefore, when the bonding portions between the chip electrodes 31 and the external electrodes 24 are locally heated, unnecessary thermal energy and thermal stress are not applied to the bonding portions between the cable electrodes 33 and the cable 40 which have already been bonded to each other.

According to such a configuration, the image pickup module 1 has high connection reliability while achieving a reduced diameter.

Figure 7:
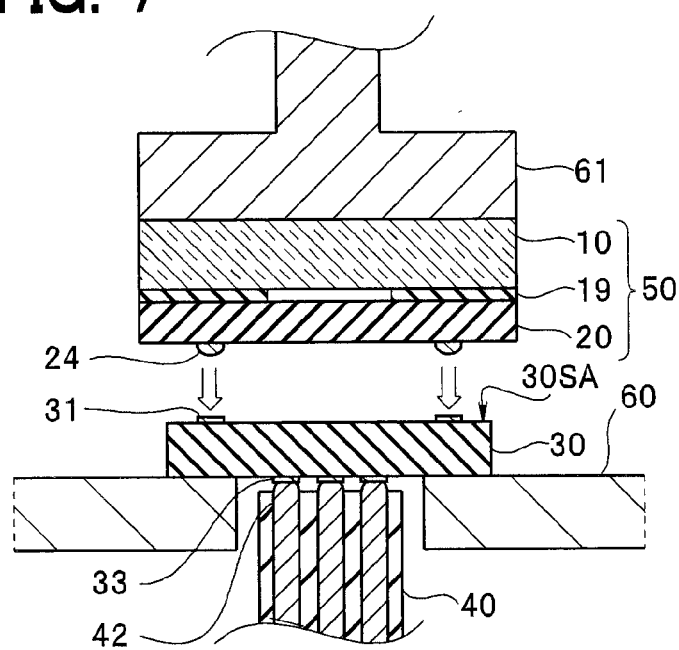
FIG. 7 is a cross-sectional view for illustrating the manufacturing method of the image pickup module according to the embodiment.

As shown in FIG. 7, the image pickup chip 50 may be held by a collet 61, and the image pickup chip 50 and the wiring board 30 may be bonded to each other by applying thermal energy to the bonding portion therebetween through the collet 61.

In addition, after the image pickup chip 50 and the wiring board 30 are bonded to each other, the cable 40 and the wiring board 30 may be bonded to each other.

<Modified Examples Of Embodiment>

Next, description will be made on image pickup modules 1A to 1E according to modified examples of the embodiment. The image pickup modules 1A to 1E according to the modified examples are similar to the image pickup module 1 according to the embodiment. Therefore, the same constituent elements are attached with the same reference numerals and description thereof will be omitted.

As in the description below, all of the image pickup modules 1A to 1E have the same effects as those of the image pickup module 1, since the cable electrodes 33 are disposed in a region which does not face the region where the chip electrodes 31 are disposed, similarly as in the image pickup module 1.

<Modified Example 1>

Figure 8A:
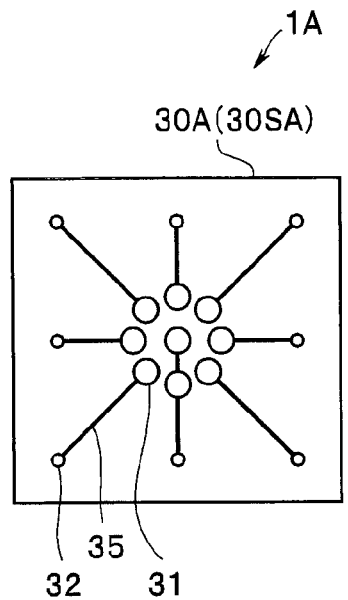
FIG. 8A is a plan view for illustrating a wiring board of an image pickup module according to a modified example 1, and shows a first main surface.
Figure 8B:
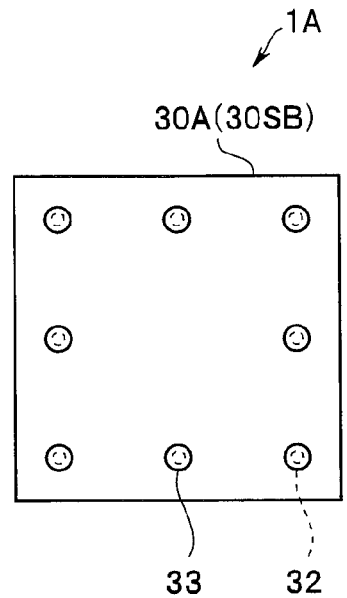
FIG. 8B is a plan view for illustrating the wiring board of the image pickup module according to the modified example 1, and shows a second main surface.

As shown in FIG. 8A, in an image pickup module 1A according to the modified example 1, chip electrodes 31 are disposed in a center portion of a first main surface 30SA of a wiring board 30A and connected, via front wirings 35, to the through wirings 32 located apart from the chip electrodes 31. In addition, as shown in FIG. 8B, cable electrodes 33 are disposed directly on through wirings 32 formed in a peripheral portion of the second main surface 30SB of the wiring board 30A.

<Modified Example 2>

Figure 9A:
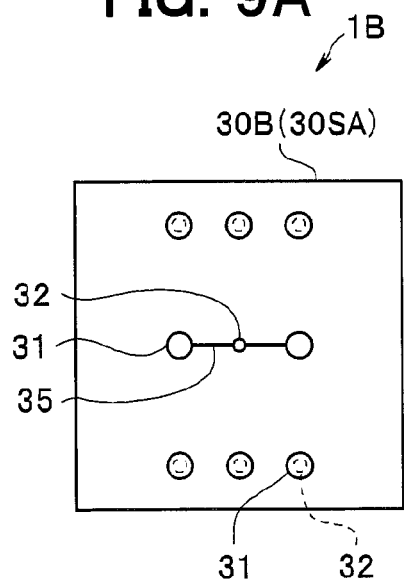
FIG. 9A is a plan view for illustrating a wiring board of an image pickup module according to a modified example 2, and shows a first main surface.
Figure 9B:
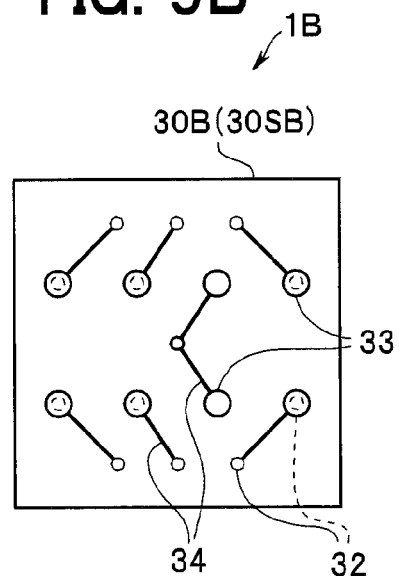
FIG. 9B is a plan view for illustrating the wiring board of the image pickup module according to the modified example 2, and shows a second main surface.

As shown in FIG. 9A, in an image pickup module 1B according to the modified example 2, chip electrodes 31 are disposed in a center portion and a peripheral portion of a first main surface 30SA of a wiring board 30B. Some chip electrodes 31 are connected to through wirings 32 via front wirings 35, and some chip electrodes 31 are connected to the through wirings 32 located directly below the chip electrodes. In addition, as shown in FIG. 9B, cable electrodes 33 are disposed in a center portion and a peripheral portion of the second main surface 30SB of the wiring board 30B. Some cable electrodes 33 are disposed directly on the through wirings 32, and some cable electrodes 33 are disposed, via front wirings 34, at positions apart from the through wirings 32. In addition, some through wirings 32 connect the cable electrodes 33 and the chip electrodes 31 via the front wirings 34, 35.

<Modified Example 3>

Figure 10A:
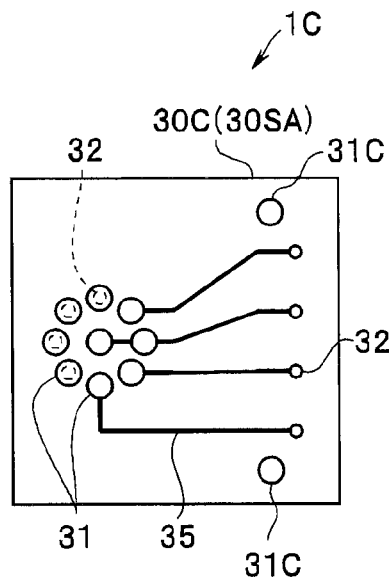
FIG. 10A is a plan view for illustrating a wiring board of an image pickup module according to a modified example 3, and shows a first main surface.

As shown in FIG. 10A, in an image pickup module 1C according to the modified example 3, a plurality of chip electrodes 31 are disposed in a region which is eccentric from the center of a first main surface 30SA of a wiring board 30C. In addition, similarly as in the image pickup module 1B, front wirings 35 are disposed on the first main surface 30SA, front wirings 34 are disposed also on a second main surface 30SB, and cable electrodes 33 are disposed in a region which does not face the region where the chip electrodes 31 are disposed. The chip electrodes 31C on the first main surface 30SA are dummy electrodes for ensuring the balance of the bonding.

Figure 10B:
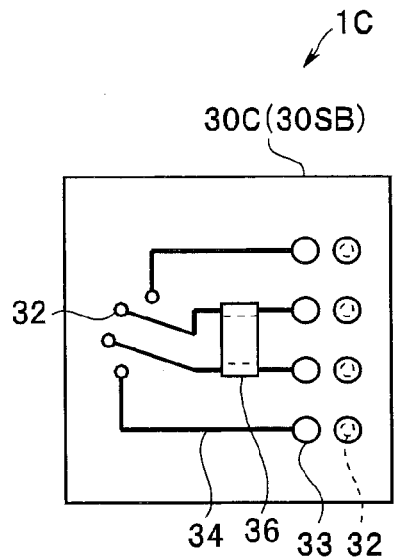
FIG. 10B is a plan view for illustrating the wiring board of the image pickup module according to the modified example 3, and shows a second main surface.

Furthermore, as shown in FIG. 10B, in the image pickup module 1C, an electronic component 36 is surface-mounted to the front wirings 34 on the second main surface 30SB of the wiring board 30C. The mounted electronic component is, for example, a chip component such as a chip capacitor. A multi-layer wiring board or a component built-in substrate may be used as a wiring board.

<Modified Example 4>

Figure 11:
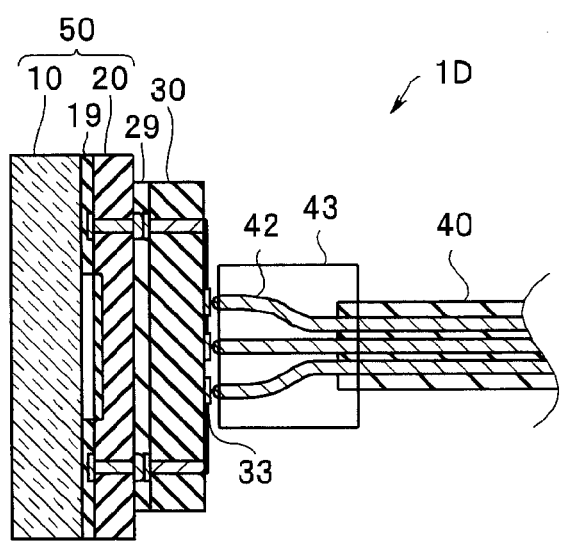
FIG. 11 is a cross-sectional view for illustrating a structure of an image pickup module according to a modified example 4.

As shown in FIG. 11, in an image pickup module 1D according to the modified example 4, end portions of a plurality of conductive wires 42 of a cable 40 are rearranged in accordance with the arrangement of a plurality of cable electrodes 33 of the wiring board 30, and integrated by a block member 43.

<Modified Example 5>

Figure 12:
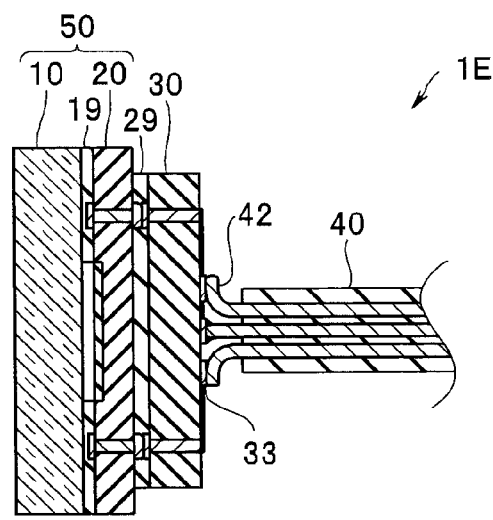
FIG. 12 is a cross-sectional view for illustrating a structure of an image pickup module according to a modified example 5.

As shown in FIG. 12, in an image pickup module 1E according to the modified example 5, end portions of a plurality of conductive wires 42 of the cable 40 are bent in accordance with the arrangement of a plurality of cable electrodes 33 of the wiring board 30. Then, the cable electrodes 33 and the conductive wires 42 are soldered to each other.

<Second Embodiment>

Figure 13:
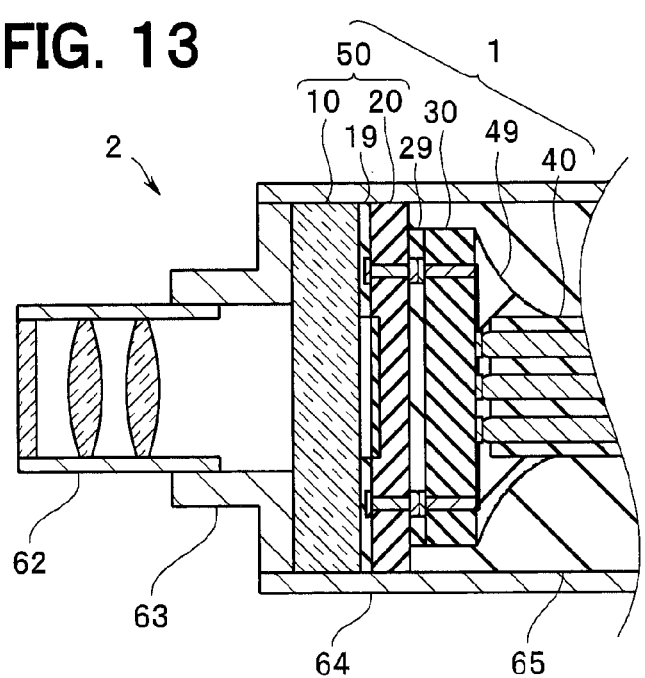
FIG. 13 is a cross-sectional view for illustrating a structure of an image pickup unit according to the embodiment.

As shown in FIG. 13, an image pickup unit 2 according to the second embodiment of the present invention includes an image pickup module 1 which has already been described, and an optical member which forms an image of an object on a light-receiving surface of an image pickup device chip. That is, the image pickup unit 2 includes a lens unit 62 (an optical lens and a lens barrel for holding the optical lens) and a lens unit holder 63 for holding the lens unit 62 which are accommodated inside of a shield frame 64 together with the image pickup module 1, and the cable 40 is sealed with a filling resin 65. The image pickup unit 2 including the image pickup module 1 has a high connection reliability and thin diameter. Therefore, the image pickup unit 2 is suitable to be disposed at a distal end portion of an electronic endoscope. Also an image pickup unit including any one of the image pickup modules 1A to 1E, instead of the image pickup module 1, has the same effects as those of the image pickup unit 2.

The present invention is not limited to the above-described embodiments or modified examples, and various changes, modifications, combination or the like are possible without changing the gist of the present invention.

What is claimed is:

1. An image pickup module comprising:
a wiring board including a first main surface on which chip electrodes are disposed and a second main surface on which cable electrodes connected respectively to the chip electrodes via respective through wirings are disposed;
an image pickup device chip including external electrodes bonded respectively to the chip electrodes; and
a cable having conductive wires bonded respectively to the cable electrodes,
wherein all of the cable electrodes are disposed in a region which does not face a region where the chip electrodes are disposed;
end portions of the conductive wires of the cable are arranged in a first arrangement in accordance with an arrangement of the cable electrodes on the second main surface of the wiring board,
the first arrangement being different from a second arrangement of the conductive wires in the cable, and
the end portions being fixed in the first arrangement by one of:
the end portions of at least some of the conductive wires being fixed in a block member in accordance with the arrangement of the cable electrodes on the second main surface of the wiring board; or
the end portions of at least some of the conductive wires of the cable being bent in accordance with the arrangement of the cable electrodes on the second main surface of the wiring board.

2. The image pickup module according to claim 1, wherein the chip electrodes are disposed in an outer peripheral portion on the first main surface, and the cable electrodes are disposed in a center portion on the second main surface.

3. The image pickup module according to claim 1, wherein the chip electrodes are disposed in a center portion on the first main surface and the cable electrodes are disposed in an outer peripheral portion on the second main surface.

4. The image pickup module according to claim 1, wherein an electronic component is surface-mounted in a region on the second main surface of the wiring board, the region not facing the region where the chip electrodes are disposed.

5. An image pickup unit comprising:
an image pickup module comprising: a wiring board including a first main surface on which chip electrodes are disposed and a second main surface on which cable electrodes connected respectively to the chip electrodes via respective through wirings are disposed; an image pickup device chip including external electrodes bonded respectively to the chip electrodes; and a cable including conductive wires bonded respectively to the cable electrodes, wherein all of the cable electrodes are disposed in a region which does not face a region where the chip electrodes are disposed; and
an optical member which forms an image of an object on a light-receiving surface of the image pickup device chip;
end portions of the conductive wires of the cable are arranged in a first arrangement in accordance with an arrangement of the cable electrodes on the second main surface of the wiring board,
the first arrangement being different from a second arrangement of the conductive wires in the cable, and
the end portions being fixed in the first arrangement by one of:
the end portions of at least some of the conductive wires being fixed in a block member in accordance with the arrangement of the cable electrodes on the second main surface of the wiring board; or
the end portions of at least some of the conductive wires of the cable being bent in accordance with the arrangement of the cable electrodes on the second main surface of the wiring board.

6. The image pickup unit according to claim 5, wherein the chip electrodes are disposed in an outer peripheral portion on the first main surface and the cable electrodes are disposed in a center portion on the second main surface.

7. The image pickup unit according to claim 5, wherein the chip electrodes are disposed in a center portion on the first main surface, and the cable electrodes are disposed in an outer peripheral portion on the second main surface.

8. The image pickup unit according to claim 5, wherein an electronic component is surface-mounted in a region on the second main surface of the wiring board, the region not facing the region where the chip electrodes are disposed.

9. The image pickup unit according to claim 5, wherein the through wirings are perpendicular to the first main surface and the second main surface of the wiring board, and the through wirings and the cable electrodes are electrically connected to each other by front wirings on the second main surface.

10. The image pickup unit according to claim 5, wherein the through wirings are configured by through holes which are filled with a conductive material.

* * * * *